United States Patent
Ward et al.

(10) Patent No.: US 7,274,247 B2
(45) Date of Patent: Sep. 25, 2007

(54) SYSTEM, METHOD AND PROGRAM PRODUCT FOR WELL-BIAS SET POINT ADJUSTMENT

(75) Inventors: Gregory H. Ward, Georgetown, TX (US); Mohamed S. Moosa, Round Rock, TX (US); Mahbub M. Rashed, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 193 days.

(21) Appl. No.: 11/098,344

(22) Filed: Apr. 4, 2005

(65) Prior Publication Data

US 2006/0220726 A1    Oct. 5, 2006

(51) Int. Cl.
  *G05F 1/10* (2006.01)
(52) U.S. Cl. .................................... 327/534
(58) Field of Classification Search ............... 327/530, 327/534, 535
  See application file for complete search history.

(56) References Cited

U.S. PATENT DOCUMENTS

| | | | |
|---|---|---|---|
| 5,825,707 A | 10/1998 | Nozawa et al. | |
| 5,942,784 A | 8/1999 | Harima et al. | |
| 6,175,263 B1 | 1/2001 | Lee et al. | |
| 6,333,571 B1 * | 12/2001 | Teraoka et al. | 307/125 |
| 6,765,430 B2 * | 7/2004 | Ando | 327/534 |
| 6,885,234 B2 * | 4/2005 | Ando | 327/534 |
| 2004/0036525 A1 | 2/2004 | Bhagavatheeswaran et al. | |
| 2004/0159858 A1 | 8/2004 | Chun et al. | |
| 2004/0216074 A1 | 10/2004 | Hart et al. | |

FOREIGN PATENT DOCUMENTS

WO   WO 2004/077081 A1   9/2004

* cited by examiner

*Primary Examiner*—Jeffrey Zweizig
(74) *Attorney, Agent, or Firm*—Dillon & Yudell LLP

(57) ABSTRACT

A well-bias system dynamically adjusts well-bias set points to optimal levels across an integrated circuit (IC) for enhanced power savings and component reliability during a standby or low-power mode of operation. A controller within the IC determines if the chip power supply voltage will be reduced during an imminent standby or low power mode and sets a register controlling a negative well-bias set point for asserting well-bias to charge wells of the IC accordingly. To minimize leakage current without compromising reliability, the well-bias set point is set to (1) an optimal well-bias set point if a reduced supply voltage is to be applied to the IC, or (2) a minimum well-bias set point when a nominal or high supply voltage is to be applied to the IC.

19 Claims, 4 Drawing Sheets

SYSTEM, METHOD AND PROGRAM PRODUCT FOR WELL-BIAS SET POINT ADJUSTMENT

BACKGROUND OF THE INVENTION

1. Field of the Invention

The present invention relates generally to semiconductor devices, and more particularly, to a system and method for dynamically adjusting well-bias of transistors in an integrated circuit.

2. Description of the Related Art

As semiconductor processes advance, the size of the devices that can be constructed on a semiconductor substrate continues to grow smaller. With the reduction in device sizes, there is a corresponding reduction in gate oxide thicknesses, and lowered threshold voltage requirements. In addition, as device sizes shrink, the problem with current leaking between devices, and between various device features, is exacerbated. Limiting device leakage currents is important, especially in portable, battery-operated products, where power consumption often dictates product success. Since many handheld products are typically not used for significant periods of time—up to 95% of the time for some products such as cellular phones—controlling the current leakage of semiconductor devices during periods when the product is not in use can result in reduced power consumption.

One method of reducing the leakage current of a semiconductor device is to increase the voltage needed to turn the transistors of the device on. For example, when a complimentary metal oxide semiconductor (CMOS) transistor is to be turned on, enough voltage must be supplied at the gate of the CMOS transistor to allow current to flow between the transistor's source and drain. The amount of voltage needed is called the threshold voltage. In order to ensure that current does not leak between the CMOS transistor's source and drain when the transistor is not in use, a well-bias circuit (e.g., a charge pump) is used to increase the transistor's threshold voltage. As a result of the increased threshold voltage, the leakage current between the transistor's source and drain can be reduced or eliminated.

FIG. 1 shows the substrate of a prior art CMOS integrated circuit (IC) using a well-bias circuit. As shown in FIG. 1, NMOS (n-channel MOS) transistor 101 are formed within P-wells 104, and PMOS (p-channel MOS) transistors 102 are formed within N-wells 106. Each of P-wells 104 and N-wells 106 reside over an electrically insulating substrate region 110. Thus, the substrate isolates the P-wells and N-wells from each other and from all other wells in the substrate.

When either a triple-well, an SOI (silicon-on-insulator) or other well isolating process is used, the P-wells and N-wells can be biased to voltage levels different from each other and from other wells of the same type. An applied voltage differential when applied to a well is referred to as a "well-bias". As the term is used herein, applying a more positive voltage to a P-well or a more negative voltage to an N-well is called applying a "positive well-bias," and applying a more negative voltage to a P-well or a more positive voltage to an N-well is called applying a "negative well-bias".

By changing the voltage level of a well-bias, the threshold voltage (Vt) of the transistors within the well is altered. An increased positive voltage in a P-well or an increased negative voltage in an N-well (i.e., a positive well-bias) causes a drop in the threshold voltage of the NMOS and PMOS transistors within the wells. This lower threshold voltage, in turn, increases the saturation drain current, which increases the performance of all of the transistors within the biased wells. For example, for NMOS transistor 101, a positive well-bias 105 of about 0.4 to 0.6 volts can be applied to P-well 104. Similarly, for PMOS transistor 102, a "positive" well-bias 107 of about −0.4 to −0.6 volts can be applied to an N-well 106. The reverse situation is also true. For example, a lower voltage in a P-well or a higher voltage in N-well 106 (i.e., a negative well-bias) causes a rise in the threshold voltage of the transistors within the well, resulting in a reduced leakage current.

While providing significant advantages in reducing leakage current, a well-bias circuit applying a negative well-bias can also result in problems during operation. In particular, if the negative well-bias voltage is set at a high enough level (magnitude), a significant amount of stress voltage may be placed on the transistor junctions between the gate and wells, and the drains and wells of the transistor. While the application of a negative well-bias will reduce the transistor leakage currents, its application under certain circumstances can create a reliability issue for the circuits. With modern chips being designed for lower supply voltages to reduce IC power consumption, the voltage levels that may cause a stress on transistor junctions are also reduced. When well-bias is applied, the cumulative well-bias and drain-to-source voltages cause various voltage stress effects across the gate-to-body and drain-to-body junctions that reduces component lifetime. As a result, use of a well-bias circuit may, in some cases, raise reliability concerns with regard to the integrated circuits implementing such systems.

What is needed, therefore, is improved circuitry for selectively biasing the well areas of an integrated circuit in a way that reduces voltage stress on the back-biased transistors, thereby increasing the reliability of the integrated circuit.

BRIEF DESCRIPTION OF THE DRAWINGS

In the following detailed description of exemplary embodiments of the invention, reference is made to the accompanying drawings, which form a part hereof, and in which is shown by way of illustration specific exemplary embodiments in which the invention may be practiced, and in which like numbers represent the same or similar elements, as follows.

DETAILED DESCRIPTION OF PREFERRED EMBODIMENTS

A preferred embodiment of the present invention provides a mechanism for dynamically adjust the well-bias set points to optimal levels across an integrated circuit (IC) to achieve enhanced power savings and component reliability during a standby or low-power mode of operation. A controller within the IC determines if the chip power supply voltage (e.g., drain/source terminal voltages) will be reduced during an imminent standby or low power mode and sets a register controlling a negative well-bias voltage accordingly. To minimize leakage current without compromising reliability, the well-bias voltage is set to:

(1) optimal well-bias set points if a reduced supply voltage is to be applied to the IC, or (2) minimum well-bias set points when a nominal or high supply voltage is to be applied to the IC.

In the following detailed description of exemplary embodiments of the invention, specific exemplary embodiments in which the invention may be practiced are described in sufficient detail to enable those skilled in the art to practice the invention, and it is to be understood that other embodiments may be utilized and that logical, architectural, programmatic, mechanical, electrical and other changes may be made without departing from the spirit or scope of the present invention. The following detailed description is, therefore, not to be taken in a limiting sense, and the scope of the present invention is defined only by the appended claims.

Figure 1:
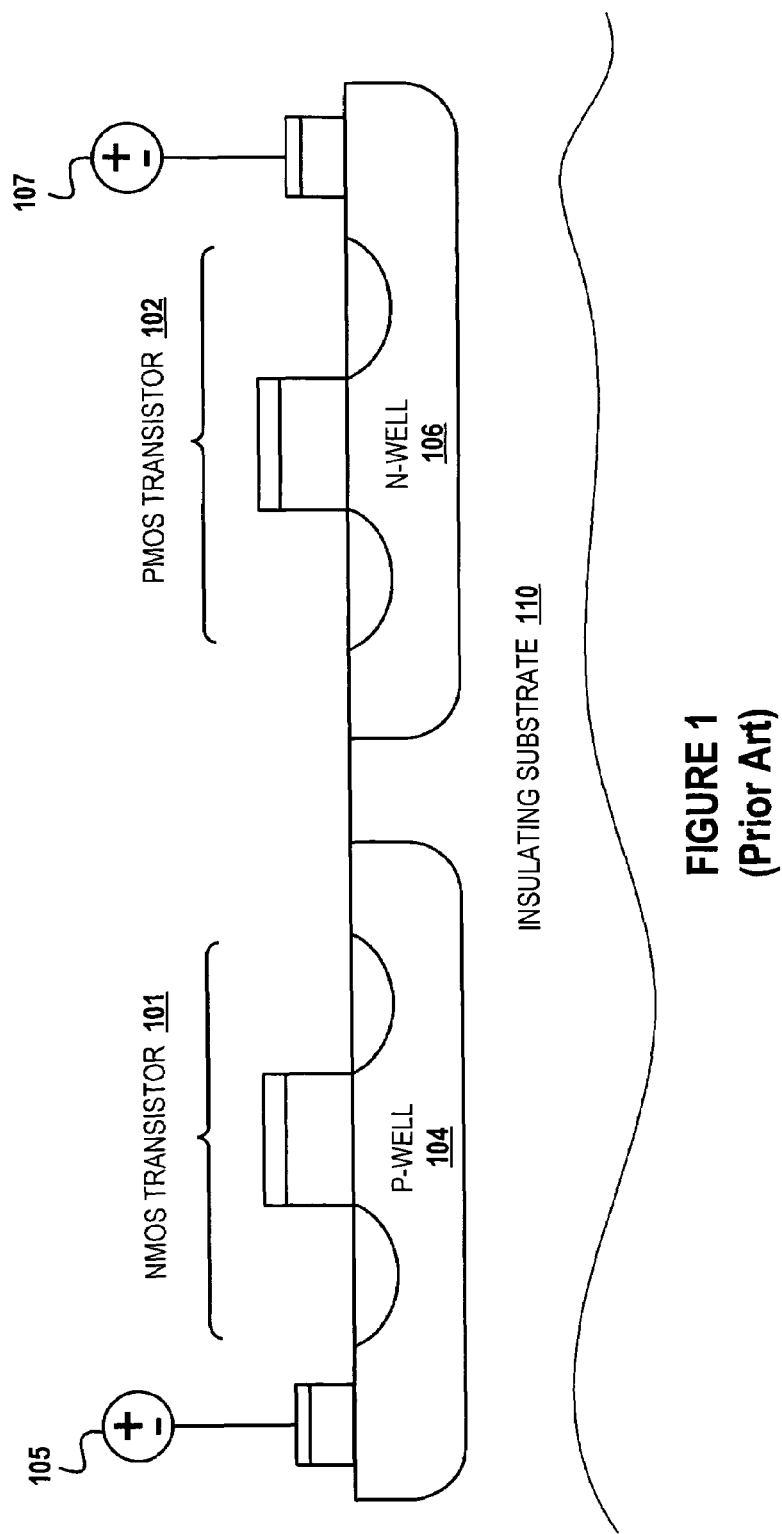
FIG. 1 shows the substrate of a prior art CMOS integrated circuit (IC) using a well-bias circuit.
Figure 2:
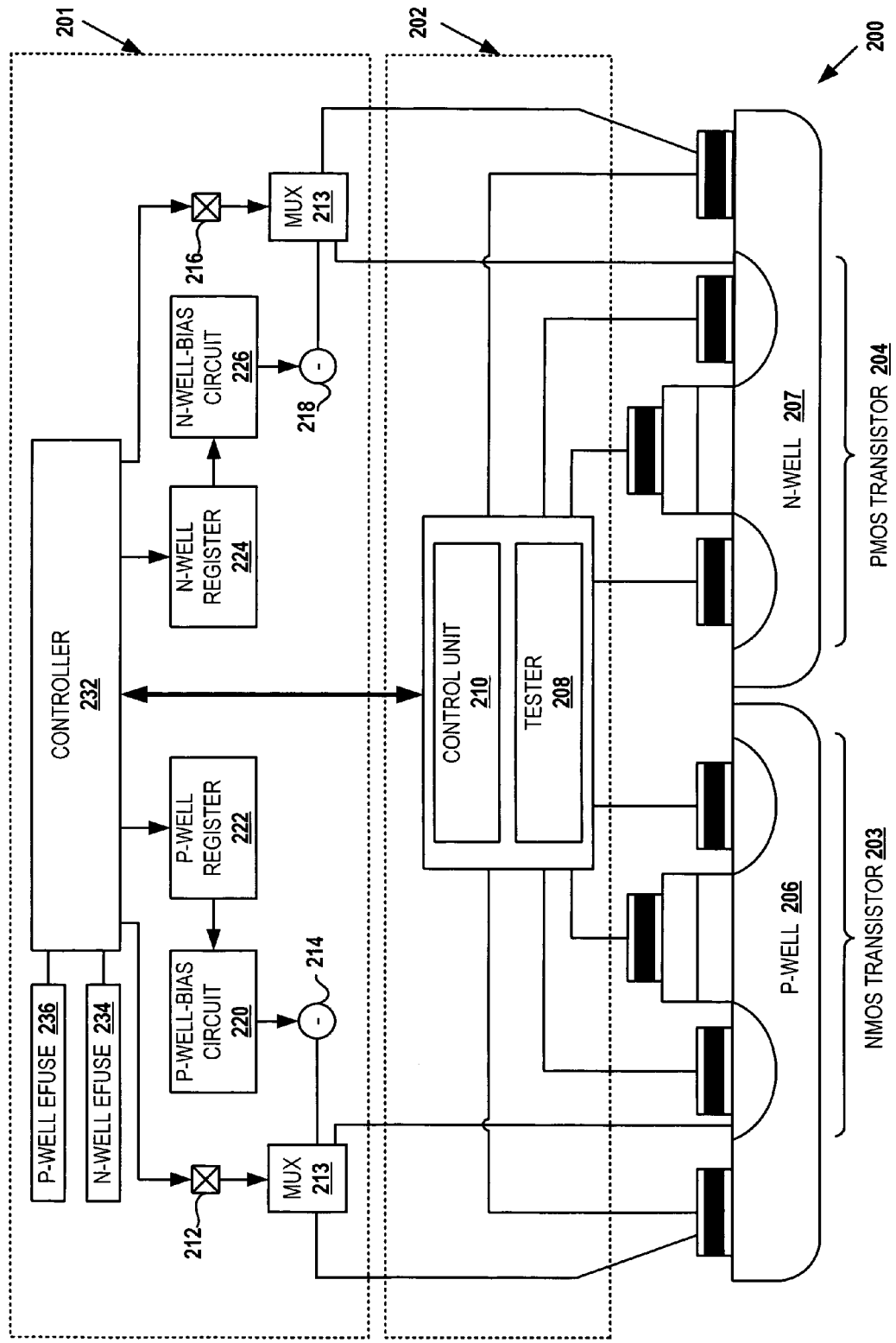
FIG. 2 shows an integrated circuit under test to determine optimal well-bias set points, in accordance with a preferred embodiment of the present invention.

With reference now to FIG. 2, there is shown an integrated circuit (IC) 200 under test to determine optimal well-bias set points, in accordance with a preferred embodiment of the present invention. The insulating substrate and the various structures formed thereon are similar to those of FIG. 1, which is formed using a triple-well or SOI process, for example. IC 200 includes NMOS transistor 203, PMOS transistor 204 and well-bias system 201. Semiconductor bulk nodes 206, 207 within transistors 203, 204 are wired separately from the chip power voltage (VDD) and ground (GND), which allows for external control of the well-bias during test. In accordance with a preferred embodiment of the present invention, optimal well-bias set points are first determined during functional probe of an integrated circuit, die or wafer through a testing methodology. The method tests IC 200 including independently modifying a p-well 206 bias of NMOS transistor 203 and an n-well 207 bias of PMOS transistor 204 to determine the optimal well-bias set points during a low-voltage operational mode of the chip power voltage. In a preferred embodiment, the chip power supply is set to the default voltage setting used during a standby mode of the IC during the well-bias set point testing.

Well-bias system 201 operates to apply well-bias on IC 200 in response to well-bias set points programmed in registers 222, 224. Registers 222, 224 are standard register memory devices contained within IC 200 and are programmable via software running on controller 200 or within control unit 210. Each register 222, 224 is a 2-bit register specifying one of four possible well-bias set point codes for each of p-well 206 and n-well 207. While shown as two separate registers, registers 222, 224 can be implemented as a single 4-bit register having 2 bits allocated to the n-well-bias set point and two bits allocated to the p-well-bias set point. Further, registers 222, 224 and the associated well-bias set point codes can be implemented using any lesser or greater number of bits than described. The two digit binary code stored in each of registers 222, 224 is received by well-bias circuits 220 and 226, respectively. Based on the well-bias set point codes received from the registers, each of the well-bias circuits 220, 226 controls the well-bias of NMOS transistor 203 via p-well 206 and a well-bias of PMOS transistor 204 via n-well 207, respectively. Well-bias circuits 220, 226 are well known in the art, and therefore are not described in detail herein. IC 200 comprises other system components in well-bias system 201 that will be identified and described in more detail in the descriptions of FIG. 3 below.

With continuing reference to FIG. 2, a testing system 202 for IC 200 is also shown. Testing system 202 may be integrated into IC 200 or, in a preferred embodiment, may be a separate electronic system coupled to IC 200. For example, testing system 202 may be a data processing system electrically coupled to IC 200 through functional probe contacts to conductive electrical transmission lines or contacts on IC 200. Testing system 202 includes a power supply that has ground (GND) coupled to the source terminal of NMOS transistor 203 and VDD coupled to the source terminal of PMOS transistor 204. In addition, testing system 202 includes a control unit 210 and a tester 208 for testing the set bias points of IC 200. Control unit 210 controls a well-bias of NMOS transistor 203 via a coupling to p-well 206, and a well-bias of PMOS transistor 204 via a coupling to n-well 207. In addition, control unit 210 is programmable to set test patterns in p-well register 222 and n-well register 224. Tester 208 detects leakage currents in transistors 203, 204 for each such test pattern, and control unit 210 then stores the test results derived from tester 208.

During such testing, IC 200 is placed in a standby or low power mode of operation having a lowered supply voltage from nominal bias conditions. As used herein, "nominal bias conditions" refers to a standard operational value including ground (GND) and VDD used during normal chip operation. Control unit 210 sets registers 222, 224 with test patterns covering each of the sixteen possible combinations of binary values for the well-bias set point codes, thereby setting the well-bias points for each of p-well 206 and n-well 207 at sixteen different possible voltage settings. Tester 208 tests the leakage current from NMOS transistor 203 and PMOS transistor 204 for each of the test patterns set by control unit 210. Upon completing testing for all possible test patterns, control unit 40 selects the combination of well-bias set point codes resulting in the optimal (lowest) leakage current, and communicates the codes to controller 200 or another production system (not shown), which stores the codes in persistent memory within IC 200.

In a preferred embodiment, the determined optimal well-bias set points are stored in electronically programmable fuses 234, 236. Storage devices 234, 236 may be, for example, electrical fuses (eFUSES), which are programmed conventionally by applying a relatively large amount of power to the fuse body to melt and separate the fuse body material. This changes the eFUSE resistance from a low pre-blown resistance to a high post-blown resistance, which is sensed to determine the state of the eFUSE. In a preferred embodiment, p-well eFUSE 236 contains two eFUSEs to store the 2-bit optimal p-well set point code determined during well-bias set point testing, as described above in conjunction with FIG. 2. Similarly, n-well eFUSE 234 contains 2 eFUSEs set to represent the n-well set point code determined in the well-bias set point testing. eFUSEs 234, 236 are coupled to controller 232 and read thereby. The optimal well-bias set points are retrieved from eFUSEs 234, 236 by operational software executing in IC 200 to provide optimized well-bias set point adjustments during standby or low power operation of the integrated circuit, as will be described in detail below.

P-well bias circuit 220 operates to receive the set point code stored in p-well register 222 and generate a well-bias at the output of voltage source 214 at the corresponding set value. N-well bias circuit 226 operates to receive the set point code stored in n-well register 224 and generate a well-bias at the output of voltage source 218 at the corresponding set value. A negative well-bias 214 can be selectively applied to p-well 206 by way of multiplexer (MUX) 213. Multiplexer 213 is a NMOS pass gate controlled by programmable memory cell 212, in a preferred embodiment. Multiplexer 213 causes the p-well to disconnect from the source node of NMOS transistor 203, while simultaneously causing the p-well to connect to the output of voltage source 214. In a preferred embodiment, multiplexer 213 is a double-pole, single-throw switch or 1×2 multiplexer, connecting the p-well 206 to the voltage source 214 when memory cell 212 is set, and connecting p-well 206 to the source terminal of transistor 203 when memory cell 212 is reset. A negative well-bias 218 (a higher voltage in the n-well) can be selectively applied to n-well 207 by way of multiplexer (MUX) 217. Multiplexer 217 is a PMOS pass gate controlled by programmable memory cell 216. Multiplexer 217 causes the n-well to disconnect from the source node of PMOS transistor 204, while simultaneously causing the n-well to connect to the output of voltage source 218. In a preferred embodiment, multiplexer 217 is a double-pole, single-throw switch or 1×2 multiplexer, connecting the n-well 207 to the voltage source 218 when memory cell 216 is set, and connecting n-well 207 to the source terminal of transistor 204 when memory cell 216 is reset. Memory cells 212, 216 can be configuration memory cells or registers. Each of memory cells 212, 216 are set by controller 232. In an alternative preferred embodiment, memory cells 212 and 216 may also be used to activate the p-well bias circuit 220 and the n-well bias circuit 226 so that the voltage source 214 and the voltage source 218 are only generated during periods when a negative well-bias mode is required to reduce the leakage.

Figure 3:
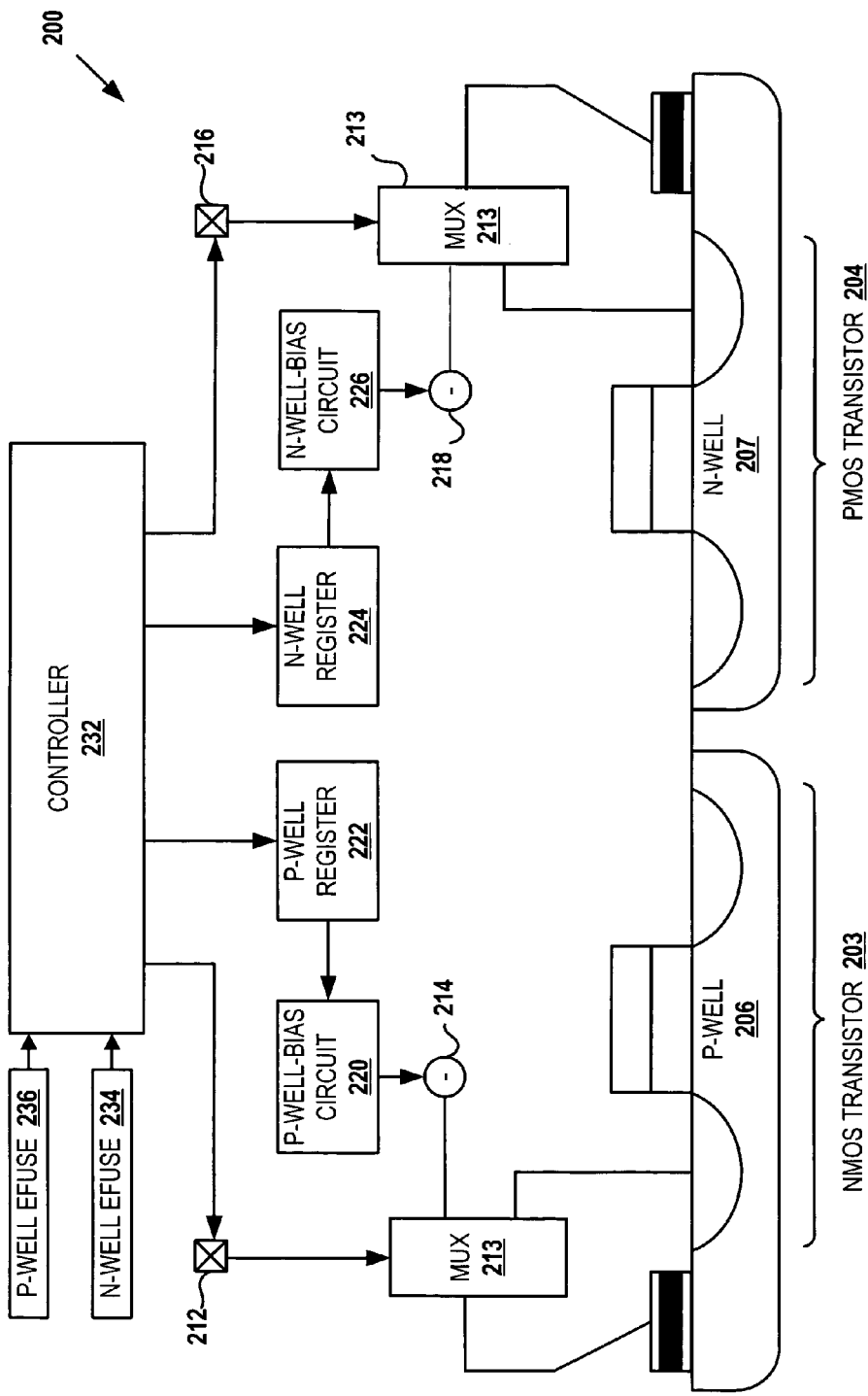
FIG. 3 a silicon substrate and block diagram of an integrated circuit, in accordance with a preferred embodiment of the present invention.

Referring next to FIG. 3, there is shown a silicon substrate and block diagram of integrated circuit 200, in accordance with a preferred embodiment of the present invention. To reduce power consumption of IC 200, a well-bias system is used to apply a negative well-bias to the transistors. However, given the detrimental effects on performance of a negative well-bias, the power saving attributes of the well-bias mode are typically only utilized in power sensitive applications such as when IC 200 is in a standby or power saving mode of operation. Consequently, well-bias voltages are disabled by resetting memory cells 212, 216 during normal operations requiring high performance, and are enabled by setting memory cells 212, 216 during known standby or "sleep" states.

In operation, "power-aware" software executing a state-machine or algorithm within controller 232 monitors operational and power states of IC 200 and detects when a transition into a low-power (or standby operational) state is imminent. In accordance with a preferred embodiment, upon identifying that a low-power state is imminent in IC 10, controller 232 reads the optimal well-bias set point codes stored in eFUSES 234, 236, and writes the well-bias set point codes into p-well register 222 and n-well register 224, if chip power supply will be reduced from nominal bias conditions. Alternatively, controller 232 sets registers 222, 224 to a minimum well-bias set point code if the imminent power state will maintain the IC supply voltage at nominal bias conditions.

As seen in FIG. 3, controller 232 writes the optimal well-bias set point codes retrieved from eFUSEs 214, 216 into p-well register 222 and n-well register 224, respectively, if the power supply will be reduced to a lower voltage condition during the low power state. In response, well-bias circuits 220, 226 drive a corresponding negative well-bias at voltage sources 214, 218 to place IC 200 in an optimal well-bias condition for reducing leakage currents during the low-voltage power state. Alternatively, controller 232 writes a minimum well-bias code into registers 222, 224, if the supply voltage will remain at a nominal or high level. This minimum back bias code is predetermined to be one of the four possible values of registers 222, 224 that will be interpreted by well-bias circuits 220, 226 to set voltage sources 214, 218 to the lowest possible bias value from among the four possible choices. A minimum bias code set to "11" in p-well register 222 causes well-bias circuit 54 to set the lowest possible negative well voltage 214. For example, in one embodiment, p-well-bias circuit 54 can set a well-bias of −0.50V, −0.75V, −1.00V and −1.25V depending on the set point code stored in p-well register 222. If controller 232 sets the minimum bias code "11" in p-well register 222, p-well-bias circuit 220 drives −0.50V from voltage source 214. N-well register 224 and n-well-bias circuit 226 operate in a similar manner. Thereafter, when IC 200 enters the low-power state, controller 232 sets memory cells 212, 216 to engage multiplexers 213, 217, thereby applying the well-bias voltages 214, 218 to the wells 206, 207.

Figure 4:
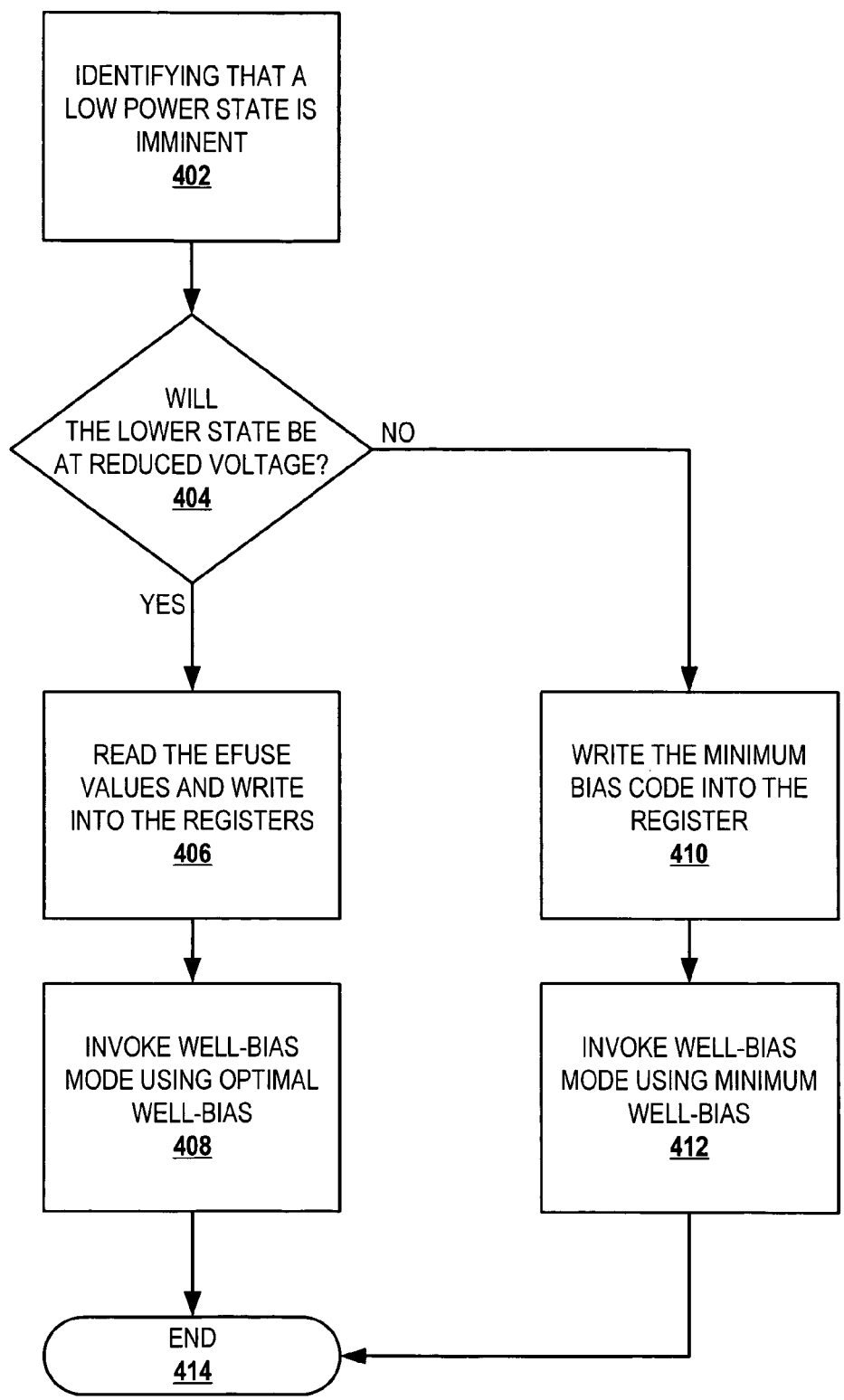
FIG. 4 is a flow diagram of a process for setting the well-bias on an integrated circuit entering into a low power state, in accordance with a preferred embodiment of the present invention.

With reference now to FIG. 4, there is shown a flow diagram of a process for setting the well-bias on an integrated circuit entering into a low power state, in accordance with a preferred embodiment of the present invention. The process begins at step 402 when software executing within controller 232 identifies that integrated circuit 200 will imminently enter into a low power state. Thereafter, power management mechanisms within controller 232 make a determination, represented at step 204, whether the imminent low power state should be at a reduced voltage relative to the system's nominal supply voltage (nominal bias conditions). If so, the process passes to step 406 of controller 232 reading set point codes from eFUSEs 234, 236 and writing those values into the registers 222, 224. The process then passes to step 408, where controller 232 invokes the well-bias mode is by setting the well-bias as specified in registers 222, 224 upon reduction of the supply voltage in the low power state. The process then ends at step 414. Returning to decision block 404, if controller 232 determines that a reduced voltage will not be applied during the imminent low power state, the process proceeds to step 410, where controller 232 writes a minimum bias code into registers 222, 224. The process then proceeds to step 412, where the well-bias mode is entered at the minimum bias level upon IC 200 entering the low power state in the nominal or higher voltage supply range. Thereafter, the process ends at step 414.

As will be appreciated, the process of FIG. 4, in preferred embodiments of the present invention, may be implemented using any combination of computer programming software, firmware or hardware. As a preparatory step to practicing the invention or constructing an apparatus according to the invention, the computer programming code (whether software or firmware) according to a preferred embodiment will typically be stored in one or more machine readable storage mediums such as fixed (hard) drives, diskettes, optical disks, magnetic tape, semiconductor memories such as ROMs, PROMs, etc., thereby making an article of manufacture in accordance with the invention. The article of manufacture containing the computer programming code is used by either executing the code directly from the storage device, by copying the code from the storage device into another storage device such as a hard disk, RAM, etc., or by transmitting the code for remote execution. The method form of the invention may be practiced by combining one or more machine-readable storage devices containing the code according to the present invention with appropriate standard computer hardware to execute the code contained therein. An apparatus for practicing the invention could be one or more computers and storage systems containing or having network access to computer program(s) coded in accordance with the invention.

In one aspect of the present invention, a system includes a well-bias circuit receiving a well-bias set point at an input, and providing bias corresponding to the well-bias set point to a charge well coupled to an output. The system further includes logic coupled to the input of the well-bias circuit for setting the well-bias set point to a first value when the system enters into a first mode of operation and setting the well-bias set point to a second value when the system enters into a second mode of operation.

In another aspect of the present invention, a method includes determining that an integrated circuit is to enter into a mode of operation, determining if a lower supply voltage relative to a nominal supply voltage of the integrated circuit will be applied during the mode of operation, setting a well-bias circuit to apply a first level of well-bias to the charge wells of the integrated circuit if the lower supply voltage will be supplied during the mode of operation, and setting the well-bias circuit to apply a second level of well-bias to the charge wells of the integrated circuit if the lower supply voltage will not be supplied to the integrated circuit during the mode of operation.

In still yet another aspect of the invention, an article of manufacture having a machine-readable medium including program logic embedded therein for setting a well-bias point that causes circuitry to perform the steps of determining that an integrated circuit is to enter into a low power mode of operation where the system operates at a supply voltage of a magnitude lower than a nominal supply voltage, determining if a lower supply voltage relative to a nominal supply voltage of the integrated circuit will be applied during the low power mode of operation, setting a well-bias circuit to apply a first level of well-bias to the charge wells of the integrated circuit if the lower supply voltage will be supplied during the low power mode of operation, and setting the well-bias circuit to apply a second level of well-bias to the charge wells of the integrated circuit if the lower supply voltage will not be supplied to the integrated circuit during the low power mode of operation.

While the invention has been particularly shown and described with reference to preferred embodiments, it will be understood by those skilled in the art that various changes in form and detail may be made therein without departing from the spirit and scope of the invention. Any variations, modifications, additions, and improvements to the embodiments described are possible and may fall within the scope of the invention as detailed within the following claims.

What is claimed is:

1. A system comprising:
   a well-bias circuit receiving a well-bias set point at an input, and providing bias corresponding to the well-bias set point to a charge well coupled to an output; and
   logic coupled to the input of the well-bias circuit for setting the well-bias set point to a first value when the system enters into a first mode of operation and setting the well-bias set point to a second value when the system enters into a second mode of operation, wherein the first mode of operation is a low power mode where the system operates at a supply voltage of a magnitude lower than a supply voltage provided to the system during the second mode of operation.

2. The system of claim 1, further comprising:
   an enable circuit having an input coupled to the logic for receiving an enable signal and an output coupled to the well-bias circuit that enables the output of the well-bias circuit in response to receiving the enable signal, wherein the logic sends the enable signal in response to the system entering into either the first or second mode of operation.

3. The system of claim 1, wherein the logic comprises a data processing component.

4. The system of claim 1, wherein the first value is a optimized well-bias at the lower supply voltage.

5. The system of claim 1, wherein the second value is a minimum well-bias of the well-bias circuit.

6. The system of claim 5, wherein the supply voltage provided to the system during the second mode of operation is a nominal bias condition.

7. A system comprising:
   a well-bias circuit receiving a well-bias set point at an input, and providing bias corresponding to the well-bias set point to a charge well coupled to an output;
   logic coupled to the input of the well-bias circuit for setting the well-bias set point to a first value when the system enters into a first mode of operation and setting the well-bias set point to a second value when the system enters into a second mode of operation; and
   one or more registers coupled to the logic and the well-bias circuit, wherein the logic sets the one or more registers to the well-bias set point, and further wherein the well-bias circuit retrieves the well-bias set point from the registers.

8. A system comprising:
   a well-bias circuit receiving a well-bias set point at an input, and providing bias corresponding to the well-bias set point to a charge well coupled to an output;
   logic coupled to the input of the well-bias circuit for setting the well-bias set point to a first value when the system enters into a first mode of operation and setting the well-bias set point to a second value when the system enters into a second mode of operation; and
   one or more storage elements coupled to the logic, wherein the storage elements store the first values, and wherein the first values are retrieved from the storage elements by the logic for setting the well-bias points during the first mode of operation.

9. A method comprising:
   determining that an integrated circuit is to enter into a mode of operation;
   determining if a lower supply voltage relative to a nominal supply voltage of the integrated circuit will be applied during the mode of operation;
   setting a well-bias circuit to apply a first level of well-bias to the charge wells of the integrated circuit if the lower supply voltage will be supplied during the mode of operation; and
   setting the well-bias circuit to apply a second level of well-bias to the charge wells of the integrated circuit if the lower supply voltage will not be supplied to the integrated circuit during the mode of operation.

10. The method of claim 9, wherein the first level of well-bias is an optimal well-bias for the integrated circuit when the lower supply voltage is supplied to the integrated circuit.

11. The method of claim 9, wherein the second level is a minimum level of well-bias for the well-bias circuit.

12. The method of claim 9, further comprising:
reading the first level from memory cells in the integrated circuit.

13. The method of claim 9, further comprising in registers, wherein setting the well-bias circuit includes transferring the first level from registers of the integrated circuit storing the first level to the well-bias circuit and setting the well-bias in accordance with the transferred first level.

14. The method of claim 9, further comprising testing the integrated circuit, wherein testing comprises:
setting a register to each possible register value;
setting the well-bias on the charge wells in response to each possible register value set in the register; and
measuring the leakage current for each setting of the well-bias in response to each possible register value set in the register.

15. The method of claim 14, wherein the first level is the register value producing the lowest measured leakage current in the integrated circuit.

16. The method of claim 9, wherein the mode of operation is a low power mode where the system operates at a supply voltage of a magnitude lower than a nominal supply voltage.

17. An article of manufacture comprising a machine-readable medium including program logic embedded therein for setting a well-bias point that causes circuitry to perform the steps of:
determining that an integrated circuit is to enter into a low power mode of operation where the system operates at a supply voltage of a magnitude lower than a nominal supply voltage;
determining if a lower supply voltage relative to a nominal supply voltage of the integrated circuit will be applied during the low power mode of operation;
setting a well-bias circuit to apply a first level of well-bias to the charge wells of the integrated circuit if the lower supply voltage will be supplied during the low power mode of operation; and
setting the well-bias circuit to apply a second level of well-bias to the charge wells of the integrated circuit if the lower supply voltage will not be supplied to the integrated circuit during the low power mode of operation.

18. The article of manufacture of claim 17, wherein the first level of well-bias is an optimal well-bias for the integrated circuit when the lower supply voltage is supplied to the integrated circuit.

19. The article of manufacture of claim 17, wherein the second level is a minimum level of well-bias for the well-bias circuit.

* * * * *